United States Patent
Kono et al.

(10) Patent No.: US 12,495,652 B2
(45) Date of Patent: Dec. 9, 2025

(54) SEMICONDUCTOR LIGHT EMITTING DEVICE AND SUPPORTING SUBSTRATE FOR SEMICONDUCTOR LIGHT EMITTING ELEMENTS

(71) Applicant: STANLEY ELECTRIC CO., LTD., Tokyo (JP)

(72) Inventors: Keima Kono, Tokyo (JP); Koji Ichikawa, Tokyo (JP); Daizo Kambara, Tokyo (JP); Naochika Horio, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 393 days.

(21) Appl. No.: 18/039,326

(22) PCT Filed: Dec. 2, 2021

(86) PCT No.: PCT/JP2021/044358
§ 371 (c)(1),
(2) Date: May 30, 2023

(87) PCT Pub. No.: WO2022/124204
PCT Pub. Date: Jun. 16, 2022

(65) Prior Publication Data
US 2024/0021767 A1    Jan. 18, 2024

(30) Foreign Application Priority Data
Dec. 10, 2020    (JP) .................................. 2020-205024

(51) Int. Cl.
H10H 20/857    (2025.01)
(52) U.S. Cl.
CPC ................................ H10H 20/857 (2025.01)

(58) Field of Classification Search
CPC .. H10H 20/857; H10H 20/8506; H10H 20/81; H10H 20/8312; H10H 20/832;
(Continued)

(56) References Cited

U.S. PATENT DOCUMENTS

| | | |
|---|---|---|
| 3,893,864 A | 7/1975 | Beers |
| 8,314,346 B2 | 11/2012 | Hasegawa et al. |

(Continued)

FOREIGN PATENT DOCUMENTS

| | | | |
|---|---|---|---|
| EP | 3062355 A1 * | 8/2016 | ............ H10H 20/83 |
| EP | 3044809 B1 | 4/2019 | |

(Continued)

OTHER PUBLICATIONS

Office Action (Non-Final Rejection) dated Jun. 30, 2025, issued in related U.S. Appl. No. 18/029,155.

(Continued)

*Primary Examiner* — Victor A Mandala
(74) *Attorney, Agent, or Firm* — Holtz, Holtz & Volek PC (57) ABSTRACT

A semiconductor light emitting device includes a semiconductor light emitting laminate, and an SOI substrate including an upper semiconductor layer, an interlayer insulating film, and a lower semiconductor layer. The SOI substrate includes a first wiring electrode provided on the upper semiconductor layer through an insulating film and corresponding to a p-electrode, a second wiring electrode connected to the upper semiconductor layer and corresponding to an n-electrode, an anode that is provided on the lower semiconductor layer and connected to a first wiring electrode by a first via electrode passing through the SOI substrate, a cathode that is provided on the lower semiconductor layer through an insulating film and connected to the upper semiconductor layer by a second via electrode reaching the upper semiconductor layer. The p-electrode and the (Continued)

n-electrode are respectively bonded to the first wiring electrode and the second wiring electrode.

11 Claims, 7 Drawing Sheets

(58) Field of Classification Search
CPC . H10H 20/84; H01L 25/167; H01L 23/49827; H01L 23/49838
See application file for complete search history.

(56) References Cited

U.S. PATENT DOCUMENTS

| | | | |
|---|---|---|---|
| 8,354,678 B1 * | 1/2013 | Fox | H10F 39/8033 |
| | | | 257/292 |
| 8,368,100 B2 | 2/2013 | Donofrio et al. | |
| 8,643,039 B2 | 2/2014 | Donofrio et al. | |
| 9,166,123 B2 | 10/2015 | Kim et al. | |
| 9,397,266 B2 | 7/2016 | Donofrio et al. | |
| 9,553,241 B2 | 1/2017 | Ichikawa | |
| 9,806,244 B2 | 10/2017 | Konishi et al. | |
| 9,941,447 B2 | 4/2018 | Ichikawa | |
| 9,947,850 B2 | 4/2018 | Konishi et al. | |
| 10,211,374 B2 | 2/2019 | Schricker et al. | |
| 10,937,937 B2 | 3/2021 | Yamane | |
| 11,289,629 B2 | 3/2022 | Shimoda et al. | |
| 11,404,608 B2 | 8/2022 | Schricker et al. | |
| 2005/0133796 A1 | 6/2005 | Seo et al. | |
| 2006/0138436 A1 | 6/2006 | Chen et al. | |
| 2008/0035942 A1 | 2/2008 | Kim et al. | |
| 2008/0043444 A1 | 2/2008 | Hasegawa et al. | |
| 2010/0084958 A1 * | 4/2010 | Shih | H01L 25/167 |
| | | | 257/101 |
| 2010/0187556 A1 | 7/2010 | Kim et al. | |
| 2010/0213498 A1 * | 8/2010 | Kim | H10H 20/8506 |
| | | | 257/99 |
| 2011/0012153 A1 * | 1/2011 | Kim | H10H 20/8506 |
| | | | 257/E33.061 |
| 2011/0085577 A1 * | 4/2011 | Krasulick | H01L 25/16 |
| | | | 257/E33.056 |
| 2011/0169037 A1 | 7/2011 | Hasegawa et al. | |
| 2012/0199861 A1 | 8/2012 | Tsuji | |
| 2012/0261705 A1 | 10/2012 | Kim et al. | |
| 2013/0020598 A1 | 1/2013 | Yang et al. | |
| 2013/0221389 A1 | 8/2013 | Yamamuro | |
| 2013/0256735 A1 | 10/2013 | Kim | |
| 2014/0042900 A1 | 2/2014 | Hotta et al. | |
| 2014/0353676 A1 | 12/2014 | Okamura et al. | |
| 2015/0108533 A1 | 4/2015 | Fukumitsu et al. | |
| 2015/0179897 A1 | 6/2015 | Andrews et al. | |
| 2015/0340567 A1 | 11/2015 | Ichikawa | |
| 2016/0141286 A1 | 5/2016 | Holz et al. | |
| 2016/0163537 A1 | 6/2016 | Tanaka | |
| 2016/0240755 A1 | 8/2016 | Stockman et al. | |
| 2016/0308101 A1 | 10/2016 | Konishi et al. | |
| 2016/0365487 A1 | 12/2016 | Schricker et al. | |
| 2017/0026071 A1 | 1/2017 | Young | |
| 2017/0084587 A1 | 3/2017 | Hung et al. | |
| 2017/0092815 A1 | 3/2017 | Ichikawa | |
| 2017/0098743 A1 | 4/2017 | Chen et al. | |
| 2017/0301841 A1 | 10/2017 | Stockman et al. | |
| 2018/0145225 A1 | 5/2018 | Perzlmaier et al. | |
| 2018/0197843 A1 | 7/2018 | Leirer et al. | |
| 2018/0212118 A1 | 7/2018 | Chen et al. | |
| 2018/0331144 A1 | 11/2018 | Lu et al. | |
| 2019/0189857 A1 | 6/2019 | Schricker et al. | |
| 2019/0312187 A1 | 10/2019 | Harada et al. | |
| 2019/0326491 A1 | 10/2019 | Koike et al. | |
| 2019/0386177 A1 | 12/2019 | Obata | |
| 2020/0020838 A1 | 1/2020 | Yamane | |
| 2020/0144462 A1 | 5/2020 | Lu et al. | |
| 2020/0185574 A1 | 6/2020 | Shimoda et al. | |
| 2020/0403028 A1 * | 12/2020 | Kusunoki | H10H 20/857 |
| 2021/0183834 A1 * | 6/2021 | Rügheimer | H10H 20/857 |
| 2024/0304611 A1 * | 9/2024 | Yamazaki | H01L 25/18 |

FOREIGN PATENT DOCUMENTS

| | | | | |
|---|---|---|---|---|
| JP | 2005191192 A | 7/2005 | | |
| JP | 2006147999 A | 6/2006 | | |
| JP | 2006190951 A | 7/2006 | | |
| JP | 2009164423 A | 7/2009 | | |
| JP | 2010219324 A | 9/2010 | | |
| JP | 2010278315 A | 12/2010 | | |
| JP | 2013175531 A | 9/2013 | | |
| JP | 2014135521 A | 7/2014 | | |
| JP | 2015008274 A | 1/2015 | | |
| JP | 2015119063 A | 6/2015 | | |
| JP | 2015156431 A | 8/2015 | | |
| JP | 2015216401 A | 12/2015 | | |
| JP | 2015225862 A | 12/2015 | | |
| JP | 2016111124 A | 6/2016 | | |
| JP | 2016224105 A | 12/2016 | | |
| JP | 2016225664 A | 12/2016 | | |
| JP | 2017504206 A | 2/2017 | | |
| JP | 2017163154 A | 9/2017 | | |
| JP | 2018195620 A | 12/2018 | | |
| JP | 6571805 B2 | 8/2019 | | |
| JP | 2019197932 A | 11/2019 | | |
| JP | 2020013820 A | 1/2020 | | |
| JP | 2020092230 A | 6/2020 | | |
| KR | 100845855 B1 * | 7/2008 | | H01L 33/00 |
| WO | 2013187318 A1 | 12/2013 | | |
| WO | 2015104928 A1 | 7/2015 | | |
| WO | 2015151686 A1 | 10/2015 | | |

OTHER PUBLICATIONS

Office Action (Non-Final Rejection) dated Jul. 30, 2025, issued in U.S. Appl. No. 18/026,596.
Japanese Office Action (and an English language translation thereof) dated Aug. 27, 2024, issued in Japanese Application No. 2022-146086 (which is a counterpart of related U.S. Appl. No. 18/029,155).
International Search Report (ISR) (and English translation thereof) dated Nov. 9, 2021, issued in International Application No. PCT/JP2021/034523.
Written Opinion dated Nov. 9, 2021, issued in International Application No. PCT/JP2021/034523.
International Search Report (ISR) (and English language translation thereof) dated Nov. 16, 2021, issued in International Application No. PCT/JP2021/037616.
U.S. Appl. No. 18/026,596, First Named Inventor: Keima Kono, filed Mar. 16, 2023, Title: "Semiconductor Light Emitting Device and Semiconductor Light Emitting Module".
U.S. Appl. No. 18/029,155, filed Mar. 29, 2023, First Named Inventor: Keima Kono, Title: "Semiconductor Light Emitting Device and Semiconductor Light Emitting Module".
Written Opinion dated Nov. 16, 2021, issued in International Application No. PCT/JP2021/037616.
International Search Report (ISR) (and an English language translation thereof) dated Jan. 11, 2022, issued in International Application No. PCT/JP2021/044358.
Written Opinion dated Jan. 11, 2022, issued in International Application No. PCT/JP2021/044358.
Extended European Search Report (EESR) dated Jan. 29, 2024, issued in European Application No. 21882648.5 (which is a counterpart of related U.S. Appl. No. 18/029,155).
Japanese Office Action (and an English language translation thereof) dated Jul. 9, 2024, issued in Japanese Application No. 2020-159480 (which is a counterpart of related U.S. Appl. No. 18/026,596).

* cited by examiner

SEMICONDUCTOR LIGHT EMITTING DEVICE AND SUPPORTING SUBSTRATE FOR SEMICONDUCTOR LIGHT EMITTING ELEMENTS

TECHNICAL FIELD

The present invention relates to a semiconductor light emitting device and a supporting substrate for semiconductor light emitting elements, and more particularly to a semiconductor light emitting device having a semiconductor light emitting element such as a light emitting diode (LED) and a supporting substrate for the semiconductor light emitting elements.

BACKGROUND ART

In recent years, in order to increase the output and control a light distribution. semiconductor light emitting elements such as a light emitting diode (LED) are disposed and used in a plurality of devices.

For example, in an automobile headlight, a variable light-distribution head lamp (ADB: Adaptive Driving Beam) that controls a light distribution according to a driving environment is known. In addition, LED packages for high-output lighting and LED packages for information and communication equipment in which LEDs are disposed at a high density, or the like are known.

However, there is a further demand for high-output semiconductor light emitting elements that can obtain uniform light emission with high light emission efficiency. Further, there is a demand for a semiconductor light emitting device which has an additional function such as a protective element while preventing a deterioration in the performance of the light emitting element and is less likely to cause element destruction.

For example, Patent Literature 1 discloses a semiconductor light emitting device including a light emitting element having a protective element formed on a back surface of the light emitting element mounted on a resin carrier. Further, Patent Literature 2 discloses a semiconductor light emitting device in which a protective element is provided on a mounting substrate of a light emitting element. Patent Literature 3 discloses a semiconductor light emitting device in which a protective element is provided in a semiconductor substrate.

CITATION LIST

Patent Literatures

Patent Literature 1: Japanese Patent No. 6571805
Patent Literature 2: International Publication No. WO2013/187318
Patent Literature 3: US Patent US 2013/0020598 A1

SUMMARY OF INVENTION

Technical Problem

The present invention has been made in view of the above points, and an object of the present invention is to provide a high-output semiconductor light emitting device that can obtain uniform light emission with high light emission efficiency. Another object of the present invention is to provide a semiconductor light emitting device that can obtain uniform light emission with high light emission efficiency and is less likely to cause element destruction due to a protective element.

Further, the present invention provides a supporting substrate used for a high-output semiconductor light emitting element that can obtain uniform light emission with high light emission efficiency and is less likely to cause element destruction due to a protective element.

Solution to Problem

The semiconductor light emitting device according to an embodiment of the present invention includes
    a semiconductor light emitting laminate in which a first conductive type first semiconductor layer, a light emitting layer, and a second conductive type second semiconductor layer are laminated, and that is provided with at least one first element electrode connected to the first semiconductor layer and at least one second element electrode connected to the second semiconductor layer on a surface on the first semiconductor layer side, and
    an SOI substrate that is formed of an upper semiconductor layer, a lower semiconductor layer, and an interlayer insulating film provided between the upper semiconductor layer and the lower semiconductor layer, in which
    the SOI substrate includes
        at least one first wiring electrode that is provided on the upper semiconductor layer through an insulating film and corresponds to the at least one first element electrode of the semiconductor light emitting element, and at least one second wiring electrode that is provided on the upper semiconductor layer by being connected to the upper semiconductor layer and corresponds to the at least one second element electrode of the semiconductor light emitting laminate,
        a first mounting electrode that is provided on the lower semiconductor layer and connected to the at least one first wiring electrode by a first via electrode passing through the SOI substrate, and
        a second mounting electrode that is provided on the lower semiconductor layer through the insulating film and connected to the upper semiconductor layer by a second via electrode passing through the lower semiconductor layer and the interlayer insulating film to reach the upper semiconductor layer, and
    the at least one first element electrode and the at least one second element electrode of the semiconductor light emitting laminate are respectively bonded to the at least one first wiring electrode and the at least one second wiring electrode of the SOI substrate.

A supporting substrate according to another embodiment of the present invention is
    a supporting substrate for mounting a semiconductor light emitting element that includes first and second semiconductor layers each having first and second conductive types, and a light emitting layer provided between the first and second semiconductor layers, and that is provided with at least one first electrode connected to the first semiconductor layer and at least one second electrode connected to the second semiconductor layer on one surface side, the supporting substrate including
    an SOI substrate that is formed of an upper semiconductor layer, a lower semiconductor layer, and an interlayer insulating film provided between the upper semiconductor layer and the lower semiconductor layer, in which the SOI substrate includes
at least one first wiring electrode that is provided on the upper semiconductor layer through an insulating film and corresponds to the at least one first electrode of the semiconductor light emitting element, and at least one second wiring electrode that is provided on the upper semiconductor layer by being connected to the upper semiconductor layer and corresponds to the at least one second electrode of the semiconductor light emitting laminate, a first mounting electrode that is provided on the lower semiconductor layer and connected to the at least one first wiring electrode by a first via electrode passing through the SOI substrate, and a second mounting electrode that is provided on the lower semiconductor layer through the insulating film and connected to the upper semiconductor layer by a second via electrode passing through the lower semiconductor layer and the interlayer insulating film to reach the upper semiconductor layer.

DESCRIPTION OF EMBODIMENTS

Hereinafter, preferred embodiments of the present invention will be described, but these embodiments may be appropriately modified and combined. In addition, in the following description and the accompanying drawings, substantially the same or equivalent parts will be described with the same reference numerals.

First Embodiment

Figure 1A:
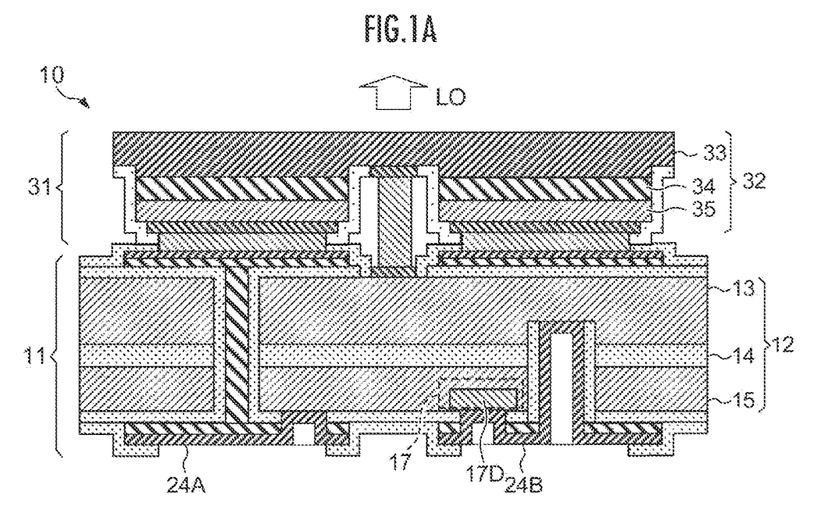
FIG. 1A is a cross-sectional view schematically illustrating a cross section of a semiconductor light emitting device 10 according to a first embodiment of the present invention.
Figure 1B:
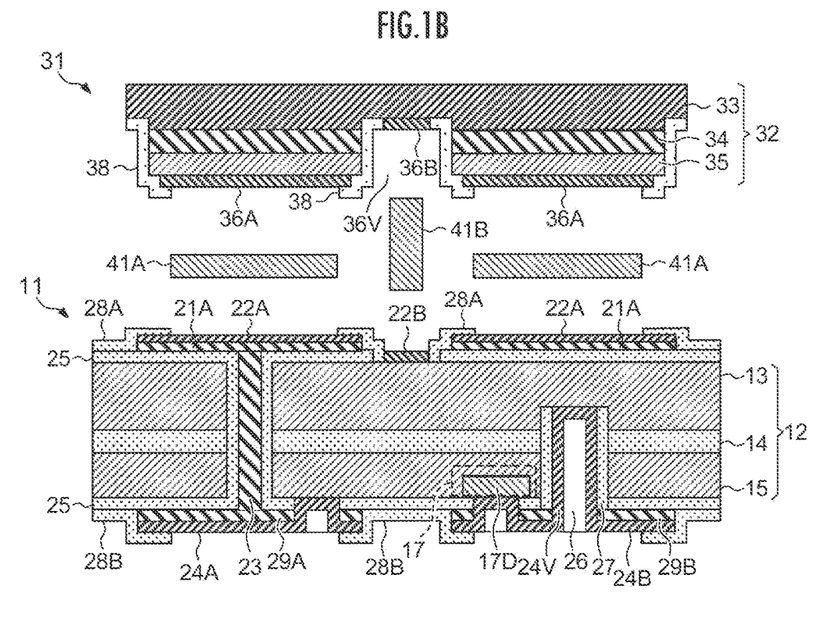
FIG. 1B is a cross-sectional view illustrating separately a semiconductor light emitting element portion and a supporting substrate portion of the semiconductor light emitting device 10.

FIG. 1A is a cross-sectional view schematically illustrating a cross section of the semiconductor light emitting device 10 according to a first embodiment of the present invention. FIG. 1B is a cross-sectional view illustrating separately a semiconductor light emitting element portion and a supporting substrate portion of the semiconductor light emitting device 10, corresponding to FIG. 1A. FIGS. 1A and 1B are cross-sectional views taken along the line A-A illustrated in FIGS. 2A and 3B.

The semiconductor light emitting device 10 includes the supporting substrate 11 and the semiconductor light emitting element 31 bonded to the supporting substrate 11. More specifically, the supporting substrate 11 is formed of a first substrate semiconductor layer 13, a second substrate semiconductor layer 15, and an interlayer insulating film 14 provided between the first substrate semiconductor layer 13 and the second substrate semiconductor layer 15.

Further, on the back surface of the supporting substrate 11, a first mounting electrode 24A and a second mounting electrode 24B that are electrically connected to the semiconductor light emitting element 31 and drive the semiconductor light emitting element 31 are provided.

In addition, a protective element 17 is provided on the second substrate semiconductor layer 15 of an SOI substrate 12. The protective element 17 is electrically connected to the semiconductor light emitting element 31 and functions as a protective circuit for the semiconductor light emitting element 31.

The light emitting diode (hereinafter, also referred to as an LED element) 31 which is a semiconductor light emitting element includes an n-type semiconductor layer 33 as a second semiconductor layer, a p-type semiconductor layer 35 as a first semiconductor layer, and a semiconductor light emitting laminate 32 formed of a light emitting layer 34 provided between the n-type semiconductor layer 33 and the p-type semiconductor layer 35 (hereinafter, referred to as an LED semiconductor layer).

In the present embodiment, the LED element 31 is bonded to the supporting substrate 11 with the p-type semiconductor layer 35 (first conductive type semiconductor layer) which is the growth outermost front surface layer as a lower surface, and the n-type semiconductor layer 33 (second conductive type semiconductor layer) is a front surface layer of the semiconductor light emitting device 10. The light emitted from the semiconductor light emitting element 31 is radiated from the n-type semiconductor layer 33 to the outside of the semiconductor light emitting device 10 (radiated light LO).

In the present embodiment, a case where the first conductive type is p-type and the second conductive type is n-type will be described, but the first conductive type may be n-type and the second conductive type may be p-type.

FIG. 1B is a schematic cross-sectional view illustrating separately the supporting substrate 11 and the semiconductor light emitting element 31 for ease of description and understanding. Hereinafter, the supporting substrate 11 and the semiconductor light emitting element 31 will be described in detail with reference to FIG. 1B.

(Supporting Substrate 11)

The supporting substrate 11 includes a substrate in which an interlayer insulating film is interposed between semiconductor layers, for example, the silicon on insulator (SOI) substrate 12. The first substrate semiconductor layer 13 and the second substrate semiconductor layer 15 are n-type Si (silicon) layers doped with, for example, P (phosphorus) or As (arsenic), and the interlayer insulating film 14 is an $SiO_2$ film. Hereinafter, the first substrate semiconductor layer 13 and the second substrate semiconductor layer 15 will be referred to as an upper Si layer 13 and a lower Si layer 15, respectively.

The supporting substrate 11 is not limited to a silicon on insulator (SOI) substrate. In the present specification, a substrate having a structure in which an interlayer insulating film is interposed between semiconductor layers such as Ge (germanium) is also referred to as a semiconductor on insulator (SOI) substrate.

A first wiring electrode 22A and a second wiring electrode 22B are provided on an upper surface of the supporting substrate 11 (a surface on a bonding side with the LED element 31) (hereinafter, referred to as a wiring electrode 22 when not particularly distinguished).

In the present embodiment, the first wiring electrode 22A is a p-wiring electrode connected to the first element electrode (p-electrode) of the semiconductor light emitting element 31, and the second wiring electrode 22B is an n-wiring electrode connected to the second element electrode (n-electrode) of the semiconductor light emitting element 31.

The first wiring electrode (p-wiring electrode) 22A and the second wiring electrode (n-wiring electrode) 22B are protected by a protective film 28A which is an insulating film (for example, a $SiO_2$ film). The first wiring electrode 22A is provided via an insulating film 25 on the upper Si layer 13, and is electrically insulated from the upper Si layer 13. The second wiring electrode 22B is provided on the upper Si layer 13 and is in ohmic contact with the upper Si layer 13.

Further, on the back surface of the supporting substrate 11, the first mounting electrode 24A and the second mounting electrode 24B (hereinafter, collectively referred to as a mounting electrode 24 when not particularly distinguished) are provided. The first mounting electrode 24A and the second mounting electrode 24B are connected to wiring on a circuit substrate such as a PCB substrate.

In the present embodiment, the first mounting electrode 24A is an anode electrode and the second mounting electrode 24B is a cathode electrode. The anode electrode 24A and the cathode electrode 24B are protected by a protective film 28B which is an insulating film (for example, a $SiO_2$ film).

The anode electrode 24A is connected to the first wiring electrode 22A via a metal via 23 that reaches from the back surface of the SOI substrate 12 (the back surface of the lower Si layer 15) to the upper surface (the front surface of the upper Si layer 13). Further, the first wiring electrode 22A, the metal via 23, and the anode electrode 24A are insulated from the SOI substrate 12 by the insulating film 25.

It is desirable that a plurality of metal vias 23 are provided from the viewpoint of preventing conduction failure between the first wiring electrode 22A and the anode electrode 24A and improving heat dissipation of heat generated by the semiconductor light emitting element 31.

The SOI substrate 12 is provided with a via (via hole) 26 that reaches from the back surface of the SOI substrate 12 to the front surface of the upper Si layer 13 or the inside thereof. The cathode electrode 24B is electrically connected to the upper Si layer 13 via the via 26.

More specifically, an insulating film 27 is provided on the inner wall of the via 26. The cathode electrode 24B has a via electrode portion 24V that is formed on the insulating film 27 and reaches the upper Si layer 13 from the back surface of the lower Si layer 15. Further, the cathode electrode 24B is insulated from the lower Si layer 15.

The via electrode portion 24V of the cathode electrode 24B is in ohmic contact with the upper Si layer 13 exposed from the via 26. Therefore, the cathode electrode 24B is electrically connected to the second wiring electrode 22B via the upper Si layer 13.

It is desirable that the plurality of vias 26 including the via electrode portion 24V are provided from the viewpoint of preventing conduction failure between the second wiring electrode 22B and the upper Si layer 13A and improving heat dissipation of heat generated by the semiconductor light emitting element 31.

Further, the protective element 17 is provided on the lower Si layer 15 of the SOI substrate 12. More specifically, the lower Si layer 15 is formed with an impurity diffusion region 17D (p-Si region) in which impurities such as B (boron) or Al (aluminum) are diffused and the protective element 17 (broken part in the drawing) which is a Zener diode (ZD) is formed by pn bonding of the impurity diffusion region 17D and the lower Si layer 15 in contact with the impurity diffusion region 17D.

The impurity diffusion region 17D (p-Si region), which is one end of the protective element 17, is connected to the cathode electrode 24B. The other end of the protective element 17 is connected to the lower Si layer 15 and electrically connected to the anode electrode 24A via the lower Si layer 15 (n-Si layer).

Figure 1C:
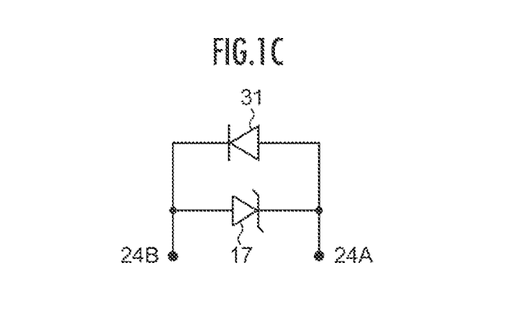
FIG. 1C is a circuit view illustrating a connection between a protective element 17 and a semiconductor light emitting element 31.

More specifically, as illustrated in FIG. 1C, a positive electrode (anode) and a negative electrode (cathode) of the protective element 17 are connected to the cathode electrode 24B and the anode electrode 24A of the semiconductor light emitting element 31, respectively, and are formed to be connected in parallel with the semiconductor light emitting element 31.

The first wiring electrode 22A is made of, for example, Ni (nickel)/Au (gold), and the second wiring electrode 22B is made of, for example, Ti (titanium) or Ni/Au. Further, the anode electrode 24A and the cathode electrode 24B are made of, for example, Ni/Au. In these electrodes. Au is the front surface layer.

(Semiconductor Light Emitting Element 31)

In the first embodiment, the LED element 31 uses a so-called thin-film LED as the LED semiconductor layer (semiconductor light emitting laminate) 32. More specifically, the LED semiconductor layer 32 has a configuration in which a semiconductor laminate (thin-film LED) having an LED structure epitaxially grown on a growth substrate is removed from the growth substrate.

The LED semiconductor layer 32 is not limited to a thin-film LED, and a semiconductor light emitting laminate in which a p-electrode and an n-electrode are provided on one surface side can be used.

The LED semiconductor layer 32 includes the n-type semiconductor layer (second semiconductor layer) 33, the light emitting layer 34, and the p-type semiconductor layer (first semiconductor layer) 35. Each of the n-type semiconductor layer 33 and the p-type semiconductor layer 35 is composed of at least one semiconductor layer, and may have various semiconductor layers such as a barrier layer, a current diffusion layer, and a contact layer according to a design such as improved characteristics.

The LED semiconductor layer 32 is, for example, a blue light emitting semiconductor layer formed of a GaN-based semiconductor layer, but is not limited thereto. The light emitting layer 34 has, for example, a single quantum well (SQW) or multiple quantum well (MQW) structure.

The LED semiconductor layer 32 is provided with a p-electrode (first element electrode) 36A and an n-electrode (second element electrode) 36B. The p-electrode 36A is formed on the front surface of the p-type semiconductor layer 35 and is in ohmic contact with the p-type semiconductor layer 35.

The LED semiconductor layer 32 is formed with vias 36V reaching the n-type semiconductor layer 33 from the front surface of the p-type semiconductor layer 35, and the n-electrode 36B is provided on the n-type semiconductor layer 33 exposed from the via 36V and is in ohmic contact with the n-type semiconductor layer 33.

An element protective film 38 made of $SiO_2$ is provided on the side surface, the bottom surface (the surface on the bonding side with the supporting substrate 11), and the inner wall surface of the via 36V of the LED semiconductor layer 32. The element protective film 38 protects the side surface of the LED semiconductor layer 32 and the inner wall surfaces of the p-electrode 36A, the n-electrode 36B, and the via 36V.

The p-electrode 36A is formed of an ITO/Ni/Pt/Ag layer in which ITO (indium tin oxide, Ni (nickel). Pt (platinum), and Ag (silver) reflective films of a translucent conductive film are formed on the p-type semiconductor layer 35 in this order. The p-electrode 36A is preferably provided with a reflective film, but may not be provided with a reflective film.

The n-electrode 36B is formed of a (Ti or Ni)/Au layer in which Ti (titanium) or Ni (nickel), and Au (gold) are formed on the n-type semiconductor layer 33 in this order.

The materials and structures of the p-electrode 36A and the n-electrode 36B are not limited to the above. The materials and structures can be appropriately selected in consideration of characteristics such as improvement of extraction efficiency by light reflection, ohmic characteristics, and element reliability (life).

(Bonding of Supporting Substrate 11 and Semiconductor Light Emitting Element 31)

The supporting substrate 11 and the semiconductor light emitting element 31 are bonded by a bonding layer 41A and a bonding layer 41B to form the semiconductor light emitting device 10 illustrated in FIG. 1A.

More specifically, the first wiring electrode (p-wiring electrode) 22A of the supporting substrate 11 is bonded to the p-electrode 36A of the semiconductor light emitting element 31 by the bonding layer 41A. The second wiring electrode 22B of the supporting substrate 11 is bonded to the n-electrode 36B of the semiconductor light emitting element 31 by the bonding layer 41B.

(Upper Surface and Back Surface of Supporting Substrate 11 and Semiconductor Light Emitting Element 31)

Figure 2A:
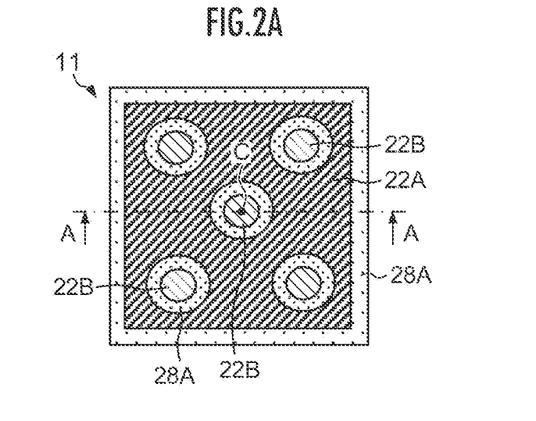
FIG. 2A is a plan view schematically illustrating an upper surface of a supporting substrate 11, that is, a surface on a bonding side with the semiconductor light emitting element 31.
Figure 2B:
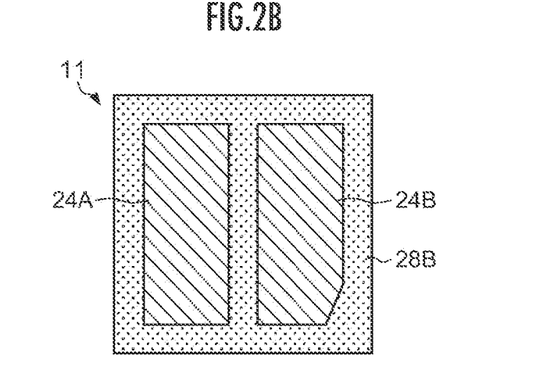
FIG. 2B is a plan view schematically illustrating a back surface of the supporting substrate 11, that is, a surface of a circuit substrate such as a PCB substrate, on which the semiconductor light emitting device 10 is mounted.

FIG. 2A is a plan view schematically illustrating an upper surface of the supporting substrate 11, that is, a surface on a bonding side with the semiconductor light emitting element 31. FIG. 2B is a plan view schematically illustrating a back surface of the supporting substrate 11, that is, a surface of a circuit substrate such as a PCB substrate, on which the semiconductor light emitting device 10 is mounted.

As illustrated in FIG. 2A, a plurality of circular second wiring electrodes 22B (n-wiring electrodes) are disposed on the supporting substrate 11 (five in the case of the present embodiment). The plurality of second wiring electrodes 22B are insulated from the first wiring electrode (p-wiring electrode) 22A by the protective film 28A which is an insulating film.

The plurality of second wiring electrodes 22B may be formed in a number, position, and size such that current diffusion is good and light emission becomes uniform.

In addition, the first wiring electrode 22A is disposed over the entire surface of the upper Si layer 13 of the SOI substrate 12, except for the regions of the plurality of second wiring electrodes 22B and the protective film 28A.

As illustrated in FIGS. 1B and 2B, the plurality of second wiring electrodes 22B are connected to the cathode electrode 24B on the back surface of the supporting substrate 11, and the first wiring electrode 22A is connected to the anode electrode 24A.

Figure 3A:
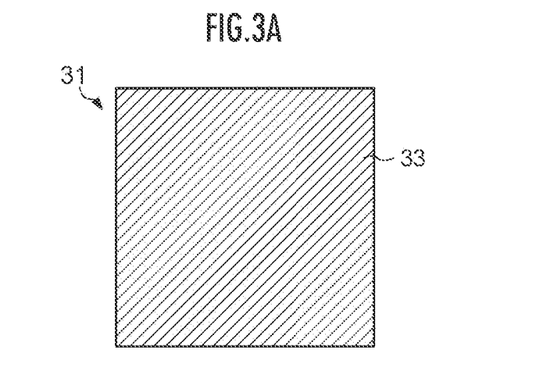
FIG. 3A is a plan view schematically illustrating an upper surface of the semiconductor light emitting element 31.
Figure 3B:
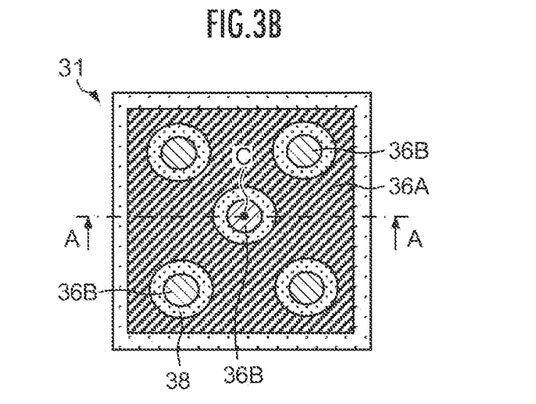
FIG. 3B is a plan view schematically illustrating a back surface (bonding surface with the supporting substrate 11) of the semiconductor light emitting element 31.

FIG. 3A is a plan view schematically illustrating the upper surface of the semiconductor light emitting element 31, that is, the surface from which the radiated light LO is emitted, and the front surface of the n-type semiconductor layer 33. Further, FIG. 3B is a plan view schematically illustrating a back surface (bonding surface with the supporting substrate 11) of the semiconductor light emitting element 31.

(Electrode Conversion Function of Supporting Substrate 11)

The supporting substrate 11 has, so to speak, an electrode conversion function. Specifically, as illustrated in FIG. 3B, one p-electrode 36A and a plurality of n-electrodes 36B (in the case of the present embodiment, five) on the back surface (bonding surface with the supporting substrate 11) of the semiconductor light emitting element 31 are provided.

It is sufficient that at least one p-electrode 36A and one n-electrode 36B are provided, but it is preferable that a plurality of n-electrodes 36B are provided. The number, size, and disposition of the p-electrodes 36A and the n-electrodes 36B can be appropriately designed according to the current diffusion and the emission brightness.

On the other hand, as illustrated in FIG. 2A, the first wiring electrode 22A and the second wiring electrode 22B corresponding to the number, size, and disposition of the p-electrodes 36A and the n-electrodes 36B of the semiconductor light emitting element 31 are provided on the upper surface (bonding surface with the semiconductor light emitting element 31) of the supporting substrate 11.

It is preferable that a plurality of n-electrodes 36B are provided (n elements, where n is an integer of 2 or more). In this case, it is preferable that the plurality of n-electrodes 36B provided on the bottom surface of the semiconductor light emitting element 31 are disposed so as to be symmetrical positions. For example, as illustrated in FIG. 3B, it is preferable that the plurality of n-electrodes 36B may be disposed at symmetrical positions with respect to a center point C of the semiconductor light emitting element 31 or the center line (for example, the symmetrical line A-A).

Further, in the present embodiment, the case where the n-electrode 36B has a circular shape has been described as an example, but the present embodiment is not limited thereto. The n-electrode 36B may have a shape according to the shape and size of the semiconductor light emitting element 31, the number, size, and disposition of the n-electrode 36B, and the like. Further, the plurality of n-electrodes 36B may not have the same shape.

Further, as illustrated in FIG. 3B, it is preferable that the p-electrode 36A of the semiconductor light emitting element 31 is formed as an electrode over the entire surface of the p-type semiconductor layer 35, so-called full-surface electrode, except the region where the n-electrode 36B is formed (that is, the region of the n-electrode 36B and the region of the element protective film 38 protecting the edge of the n-electrode 36B).

As illustrated in FIG. 2B, each anode electrode 24A and cathode electrode 24B are provided on the back surface of the supporting substrate 11 (that is, the surface of the circuit substrate on which the semiconductor light emitting device 10 is mounted), and the p-electrodes 36A and the n-electrodes 36B of the semiconductor light emitting element 31 are connected to each other.

That is, even when a plurality of p-electrodes 36A and/or n-electrodes 36B are provided in the semiconductor light emitting element 31 in order to improve element characteristics such as current diffusion, the anode electrode 24A and the cathode electrode 24B of the supporting substrate 11 can be integrated into each one, and it is possible to facilitate the wiring of the circuit substrate such as a PCB substrate.

[Manufacturing Method of Supporting Substrate 11]

Figure 4A:
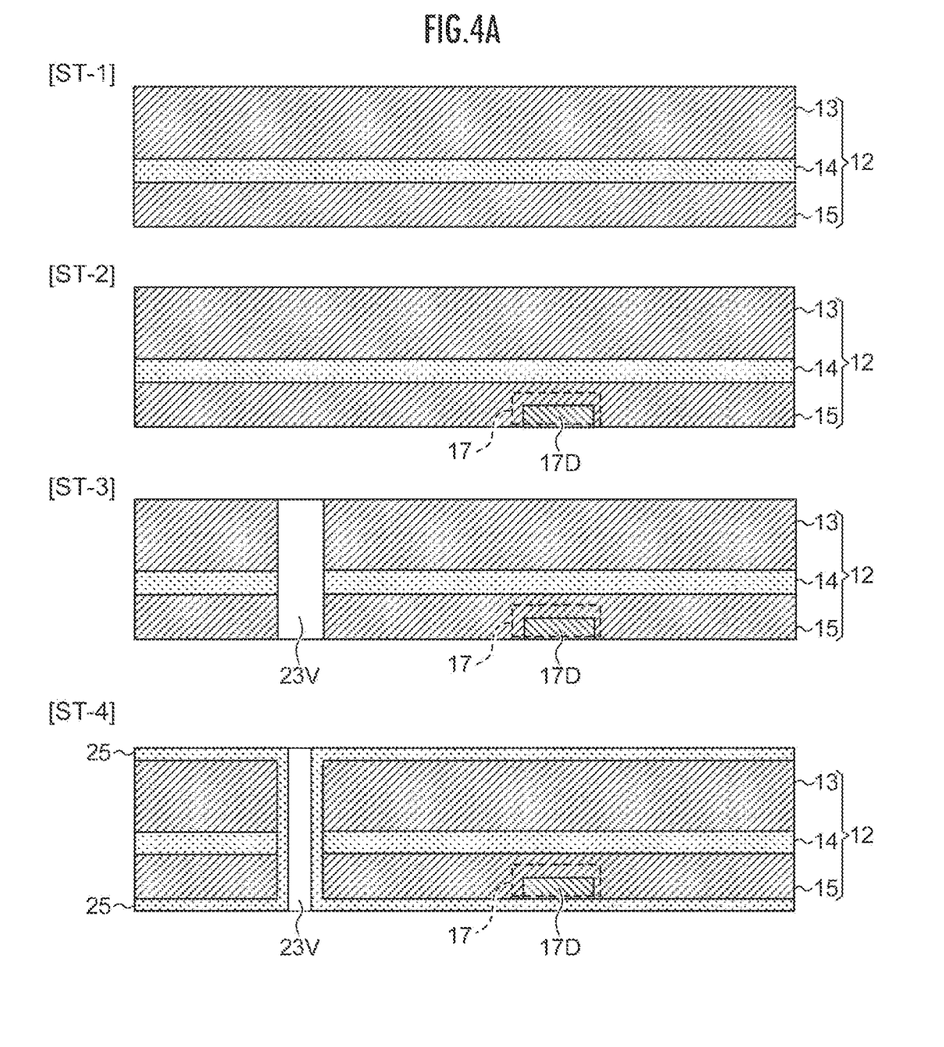
FIG. 4A is a cross-sectional view schematically illustrating a manufacturing method of the supporting substrate 11.
Figure 4B:
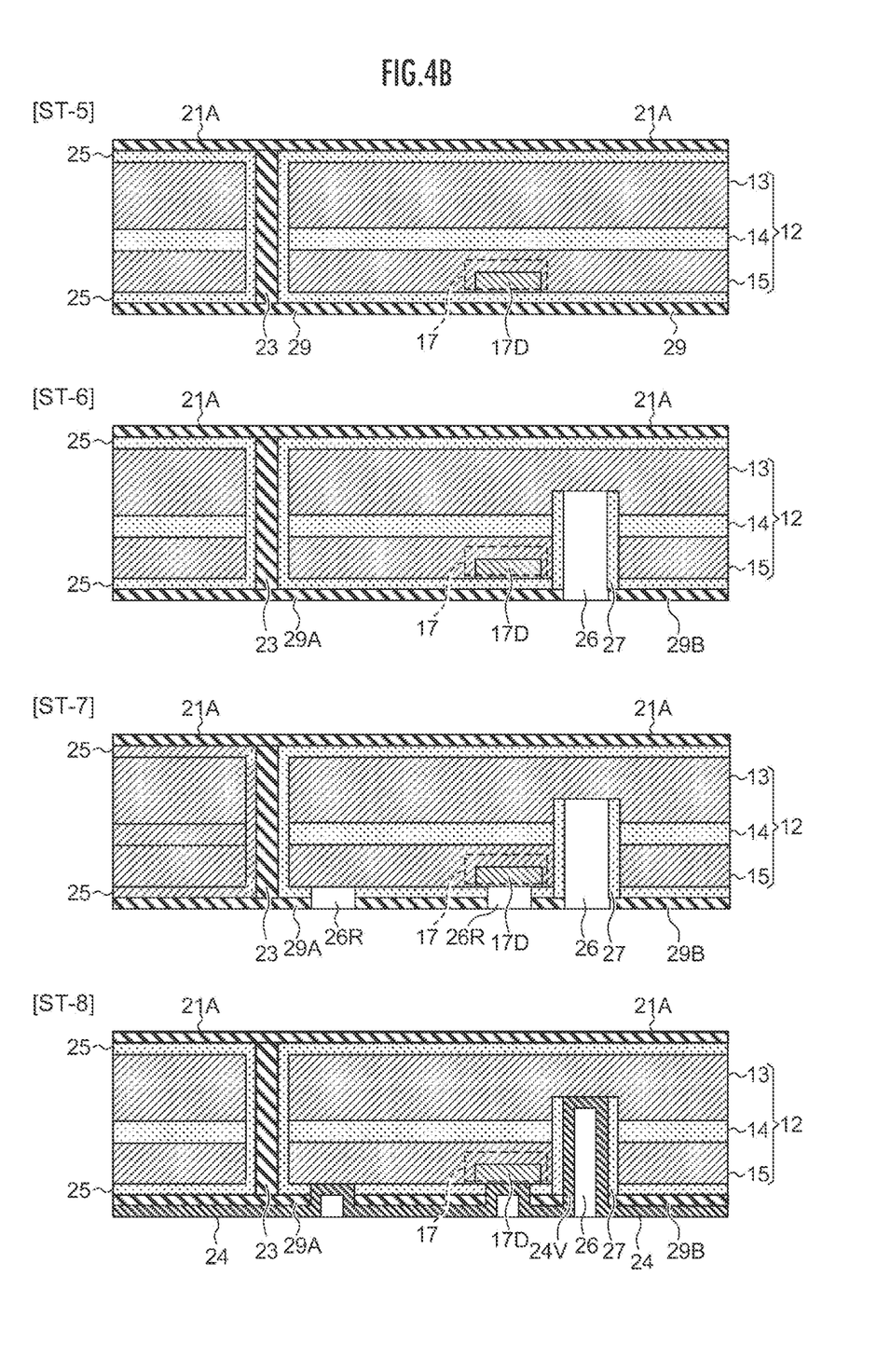
FIG. 4B is a cross-sectional view schematically illustrating a manufacturing method of the supporting substrate 11.
Figure 4C:
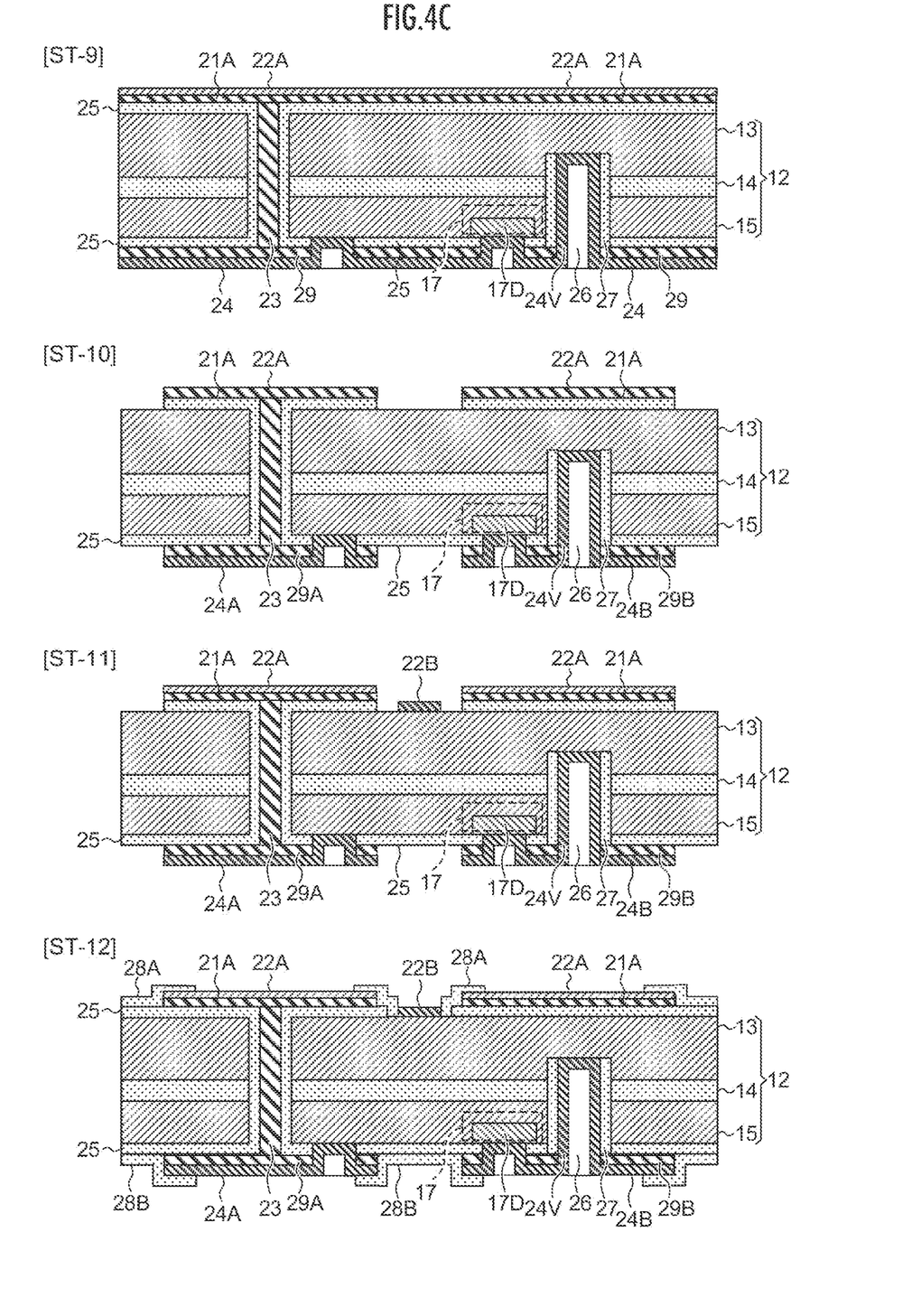
FIG. 4C is a cross-sectional view schematically illustrating a manufacturing method of the supporting substrate 11.

Hereinafter, FIGS. 4A to 4C are cross-sectional views schematically illustrating a manufacturing method of the supporting substrate 11. A method for manufacturing the supporting substrate 11 will be described in detail and specifically with reference to FIGS. 4A to 4C. The supporting substrate 11 was manufactured by the following steps-1 to 12 (ST-1 to ST-12).

(ST-1)

The SOI substrate 12 having the interlayer insulating film 14 formed of the upper Si layer 13 which is an n-Si layer doped with P or As, the lower Si layer 15, and a $SiO_2$ film was prepared.

(ST-2)

An impurity such as B or Al was diffused from the lower surface of the lower Si layer 15 by ion implantation, thermal diffusion, or the like to form a diffusion region 17D (p-Si region) of a p-impurity. As a result, the protective element 17 (broken part in the drawing) which is a Zener diode was formed in the lower Si layer 15.

(ST-3)

A Via (through hole) 23V reaching from the lower surface of the lower Si layer 15 to the front surface of the upper Si layer 13 was formed.

(ST-4)

A $SiO_2$ film which is the substrate insulating film 25 was formed by plasma CVD using TEOS (tetraethoxysilane). The front surface of the upper Si layer 13, the lower surface of the lower Si layer 15, and the inner wall surface of the via 23V were coated with the insulating film 25.

(ST-5)

A copper (Cu) layer was formed on the front surface of the upper Si layer 13 and on the lower surface of the lower Si layer 15 by sputtering or electroless plating and electroplating. In addition, the inside of the via 23V was filled with Cu. As a result, a base metal layer 21A (the front surface of the upper Si layer 13) which is a Cu layer, a base metal layer 29 (the lower surface of the lower Si layer 15), and the metal vias 23 were formed.

(ST-6)

The via (through hole) 26 reaching from the lower surface of the lower Si layer 15 to the upper Si layer 13 was formed. More specifically, the via 26 was formed by etching while forming a $SiO_2$ film (insulating film 27) on the inner wall by a D-RIE (Deep RIE) process or a Bosch process.

(ST-7)

The substrate insulating film 25 and the base metal layer (Cu layer) 29 were etched by wet etching or dry etching to form a hole portion 26R that exposes the impurity diffusion region 17D and the lower Si layer 15.

(ST-8)

Ni and Au were deposited on the lower surface of the lower Si layer 15 in this order by an electron beam (EB) method or sputtering to form a back surface electrode layer 24 which is a Ni/Au layer.

As a result, an ohmic contact between the diffusion region 17D and the lower Si layer 15 that serve as electrodes of the protective element (Zener diode) 17 was formed. In addition, the via electrode portion 24V of the cathode electrode 24B, which is an ohmic contact electrode with the upper Si layer 13, was formed.

It is also possible to form the back surface electrode layer 24 thickly and embed the via 26 by the via electrode portion 24V. In this case, the heat dissipation by the via electrode portion 24V can be improved.

(ST-9)

The Ni/Au layer 22A was formed on the base metal layer (Cu layer) 21A on the upper Si layer 13.

(ST-10)

The base metal layer 21A and the Ni/Au layer 22A on the upper Si layer 13 and the base metal layer 29 and the back surface electrode layer 24 on the lower surface of the lower Si layer 15 were etched by wet etching or dry etching.

As a result, the first wiring electrode 22A, the anode electrode 24A, and the cathode electrode 24B were patterned.

(ST-11)

Ti (titanium) or Ni, Au was deposited in this order on the upper Si layer 13 exposed in step ST-10 by an electron beam (EB) method or sputtering to form the second wiring electrode 22B which is (Ti or Ni)/Au layer.

(ST-12)

The substrate protective films 28A and 28B were formed by sputtering or plasma CVD using TEOS.

The supporting substrate 11 was manufactured by the above steps ST-1 to ST-12.

In particular, the heat transfer property (heat dissipation) in the vertical direction of the supporting substrate 11 is improved by the metal vias 23 and the via electrode portion 24V passing through the interlayer insulating film 14 that separates the first substrate semiconductor layer 13 and the second substrate semiconductor layer 15, in the vertical direction with respect to the film surface of the interlayer insulating film.

As described above, the semiconductor light emitting device 10 was manufactured by bonding the supporting substrate 11 manufactured as described above to the semiconductor light emitting element 31 by the bonding layer 41A and the bonding layer 41B.

According to the semiconductor light emitting device 10 of the first embodiment described above, it is possible to provide a high-output semiconductor light emitting device that can obtain uniform light emission with high light emission efficiency. In addition, it is possible to provide a high-output semiconductor light emitting device that can obtain uniform light emission and is less likely to cause element destruction due to a protective element.

Further, it is possible to provide a high-output semiconductor light emitting device by improving heat dissipation by means of the metal vias 23 penetrating the interlayer insulating film 14 and the via electrode portion 24V.

In addition, it is possible to provide a high-output semiconductor light emitting device that facilitates wiring of a circuit substrate or the like on which a semiconductor light emitting device is mounted.

Second Embodiment

Figure 5A:
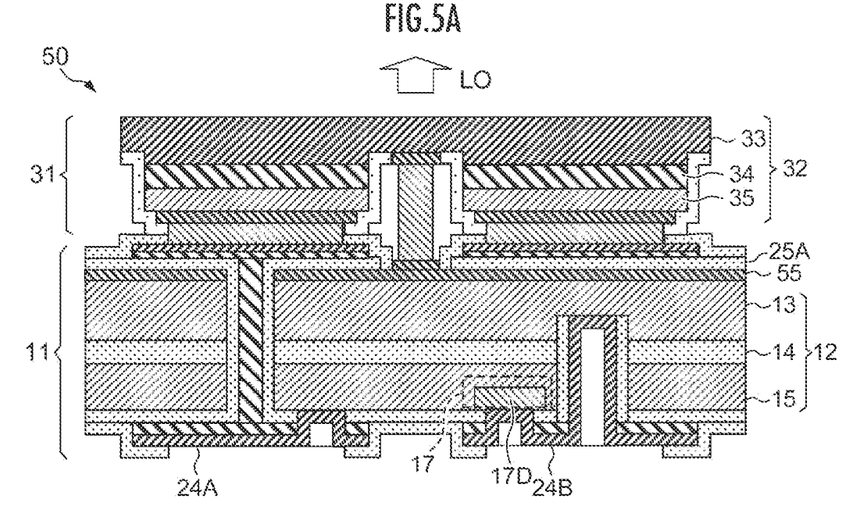
FIG. 5A is a cross-sectional view schematically illustrating a cross section of a semiconductor light emitting device 50 according to a second embodiment of the present invention.
Figure 5B:
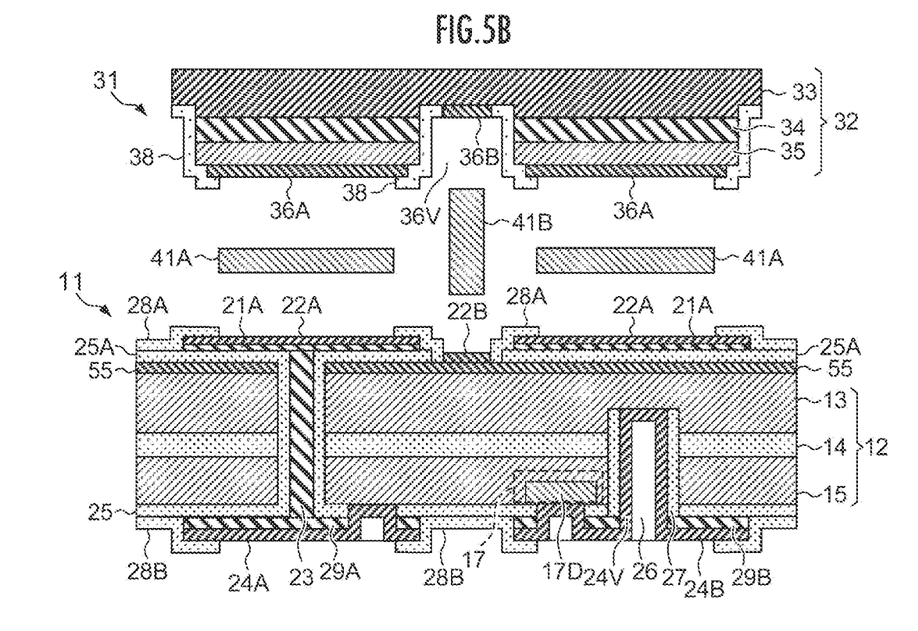
FIG. 5B is a cross-sectional view illustrating separately the semiconductor light emitting element 31 and the supporting substrate 11 of the semiconductor light emitting device 50 according to the second embodiment.

FIG. 5A is a cross-sectional view schematically illustrating a cross section of the semiconductor light emitting device 50 according to a second embodiment of the present invention. FIG. 5B is a cross-sectional view illustrating separately a semiconductor light emitting element portion and a supporting substrate portion of the semiconductor light emitting device 50, corresponding to FIG. 5A.

The semiconductor light emitting device 50 according to the second embodiment is the same as the semiconductor light emitting device 10 according to the first embodiment described above, in that a metal electrode layer is provided between the upper Si layer 13 and the insulating film 25.

More specifically, as illustrated in FIGS. 5A and 5B, when the insulating film between the upper Si layer 13 and the first wiring electrode 22A provided on the upper Si layer 13 side is an insulating film 25A, the metal electrode layer 55 is provided between the upper Si layer 13 and the first wiring electrode 22A, that is, on the upper Si layer 13.

The metal electrode layer 55 is electrically connected to the second wiring electrode 22B (n-wiring electrode). Therefore, even in a case where the current diffusion is insufficient due to the resistivity of the upper Si layer 13 (n-Si layer), it is possible to improve current diffusion and to improve in-plane uniformity of light emission and light emission efficiency.

The metal electrode layer 55 is preferably formed over the entire surface of the upper Si layer 13.

Figure 6:
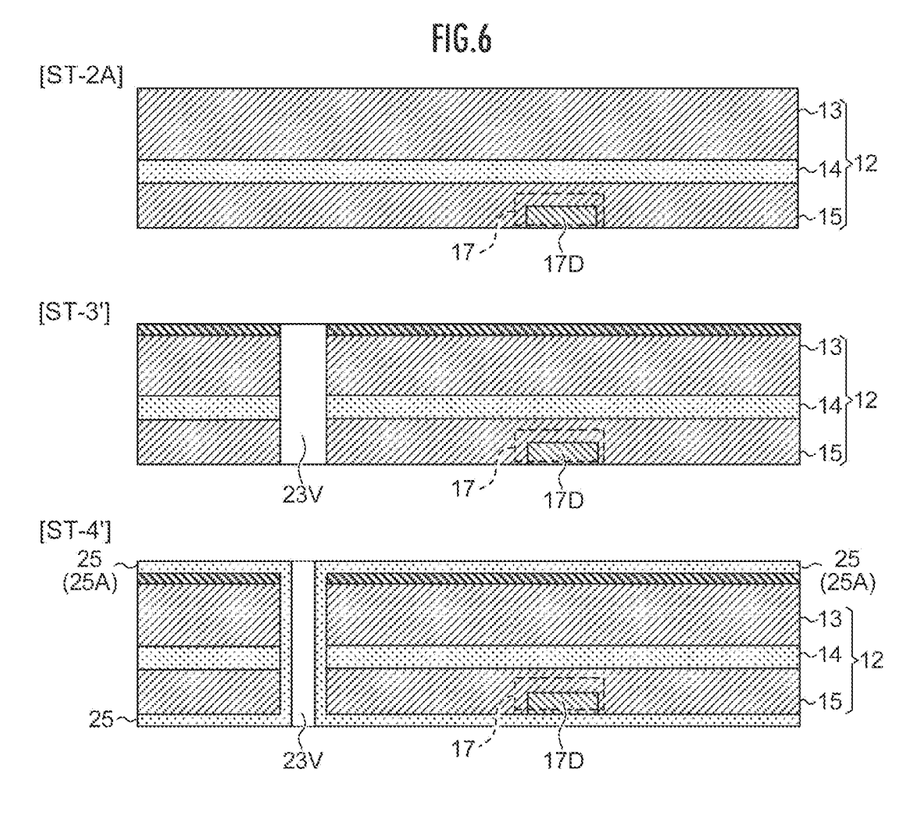
FIG. 6 is a cross-sectional view schematically illustrating a method of forming a metal electrode layer 55 in the second embodiment.

FIG. 6 is a cross-sectional view schematically illustrating a method of forming the metal electrode layer 55. The metal electrode layer 55 is additionally executed as the following step ST-2A after step ST-2 described in the first embodiment.

In addition, ST-3' and ST-4' are executed instead of ST-3 and ST-4 in the first embodiment. After step ST-5, steps ST-5 to ST-12 described in the first embodiment are executed.
(ST-2A)

After the protective element 17 was formed in ST-2. Ti or Ni, and Au were deposited in this order by sputtering, an electron beam method, resistance heating deposition, plating, or the like, and the metal electrode layer 55 which is a (Ti or Ni)/Au layer was formed.
(ST-3')

The via (through hole) 23V reaching the front surface of the metal electrode layer 55 from the lower surface of the lower Si layer 15 was formed.
(ST-4')

A $SiO_2$ film which is the substrate insulating film 25 was formed by plasma CVD using TEOS (tetraethoxysilane). The front surface of the upper Si layer 13, the front surface of the metal electrode layer 55, and the inner wall surface of the via 23V were coated with the insulating film 25. Here, an insulating film formed on the metal electrode layer 55 is illustrated as the insulating film 25A (a part of the insulating film).

As described above, according to the semiconductor light emitting device 50 of the second embodiment, it is possible to provide a high-output semiconductor light emitting device that can obtain uniform light emission with higher light emission efficiency. Further, since the metal electrode layer 55 acts as a heat conductive layer (heat spreader) that guides the heat generated by the semiconductor light emitting element 31 to the vias 23 and 26, it is possible to provide a high-output semiconductor light emitting device. In addition, it is possible to provide a high-output semiconductor light emitting device that can obtain extremely uniform light emission and is less likely to cause element destruction due to a protective element.

As described in detail above, according to the semiconductor light emitting device of the present embodiment, it is possible to provide a high-output semiconductor light emitting device that can obtain uniform light emission with high light emission efficiency. In addition, it is possible to provide a high-output semiconductor light emitting device that can obtain uniform light emission and is less likely to cause element destruction due to a protective element.

In addition, it is possible to provide a high-output semiconductor light emitting device that facilitates wiring of a circuit substrate or the like on which a semiconductor light emitting device is mounted.

Furthermore, it is possible to provide a supporting substrate used for a high-output semiconductor light emitting element that can obtain uniform light emission with high light emission efficiency and is less likely to cause element destruction due to a protective element.

DESCRIPTION OF REFERENCE NUMERALS 10, 50: semiconductor light emitting device
11: supporting substrate
12: SOI substrate
13: first substrate semiconductor layer
14: interlayer insulating film
15: second substrate semiconductor layer
17: protective element
17D: impurity diffusion region
22A: first wiring electrode
22B: second wiring electrode
23: metal via
24A: anode electrode
24B: cathode electrode
25, 25A: insulating film
26: via (through hole)
28A, 28B. 38A, 38B: protective film
31: semiconductor light emitting element
32: semiconductor light emitting laminate
33: n-type semiconductor layer
34: light emitting layer
35: p-type semiconductor layer
36A: p-electrode
36B: n-electrode
55: metal electrode layer

The invention claimed is:

1. A semiconductor light emitting device comprising:
a semiconductor light emitting laminate in which a first conductive type first semiconductor layer, a light emitting layer, and a second conductive type second semiconductor layer are laminated, and that is provided with at least one first element electrode connected to the first semiconductor layer and at least one second element electrode connected to the second semiconductor layer on a surface on the first semiconductor layer side; and
an SOI substrate that comprises an upper semiconductor layer, a lower semiconductor layer, and an interlayer insulating film provided between the upper semiconductor layer and the lower semiconductor layer,
wherein:
the SOI substrate includes:
at least one first wiring electrode that is provided on the upper semiconductor layer through an insulating film and corresponds to the at least one first element electrode of the semiconductor light emitting element, and at least one second wiring electrode that is provided on the upper semiconductor layer by being connected to the upper semiconductor layer and corresponds to the at least one second element electrode of the semiconductor light emitting laminate,
a first mounting electrode that is provided on the lower semiconductor layer and connected to the at least one first wiring electrode by a first via electrode passing through the SOI substrate, and a second mounting electrode that is provided on the lower semiconductor layer through the insulating film and connected to the upper semiconductor layer by a second via electrode passing through the lower semiconductor layer and the interlayer insulating film to reach the upper semiconductor layer, and the at least one first element electrode and the at least one second element electrode of the semiconductor light emitting laminate are respectively bonded to the at least one first wiring electrode and the at least one second wiring electrode of the SOI substrate.

2. The semiconductor light emitting device according to claim 1, wherein the upper semiconductor layer and the lower semiconductor layer are n-Si layers, and the lower semiconductor layer is connected to the first mounting electrode and includes an impurity diffusion region that is provided on a front surface of the lower semiconductor layer, and is connected to the second mounting electrode to form a pn bonding in the lower semiconductor layer.

3. The semiconductor light emitting device according to claim 1, wherein the first conductive type and the second conductive type are p-type and n-type, respectively, and the at least one second element electrode is provided on the second semiconductor layer exposed from a via reaching the second semiconductor layer from a front surface of the first semiconductor layer.

4. The semiconductor light emitting device according to claim 1, wherein the first conductive type and the second conductive type are p-type and n-type, respectively, and the at least one first element electrode includes a translucent conductive film and a reflective film.

5. The semiconductor light emitting device according to claim 1, wherein the semiconductor light emitting laminate includes a plurality of the second element electrodes, and the plurality of second element electrodes are disposed at symmetrical positions on the surface of the first semiconductor layer side.

6. The semiconductor light emitting device according to claim 1, wherein the first element electrode is formed as a full-surface electrode over an entire surface of the first semiconductor layer except for a region of the at least one second wiring electrode.

7. The semiconductor light emitting device according to claim 1, further comprising:
a metal electrode layer that is provided on the upper semiconductor layer and connected to the at least one second wiring electrode.

8. The semiconductor light emitting device according to claim 7, wherein the metal electrode layer is formed over an entire surface of the upper semiconductor layer.

9. A supporting substrate for mounting a semiconductor light emitting element that includes first and second semiconductor layers each having first and second conductive types, and a light emitting layer provided between the first and second semiconductor layers, and that is provided with at least one first electrode connected to the first semiconductor layer and at least one second electrode connected to the second semiconductor layer on one surface side, the supporting substrate comprising:

an SOI substrate that is formed of an upper semiconductor layer, a lower semiconductor layer, and an interlayer insulating film provided between the upper semiconductor layer and the lower semiconductor layer, wherein the SOI substrate includes:
at least one first wiring electrode that is provided on the upper semiconductor layer through an insulating film and corresponds to the at least one first electrode of the semiconductor light emitting element, and at least one second wiring electrode that is provided on the upper semiconductor layer by being connected to the upper semiconductor layer and corresponds to the at least one second electrode of the semiconductor light emitting laminate, a first mounting electrode that is provided on the lower semiconductor layer and connected to the at least one first wiring electrode by a first via electrode passing through the SOI substrate, and a second mounting electrode that is provided on the lower semiconductor layer through the insulating film and connected to the upper semiconductor layer by a second via electrode passing through the lower semiconductor layer and the interlayer insulating film to reach the upper semiconductor layer.

10. The supporting substrate according to claim 9, wherein the upper semiconductor layer and the lower semiconductor layer are n-Si layers, and the lower semiconductor layer is connected to the first mounting electrode and includes an impurity diffusion region that is provided on a front surface of the lower semiconductor layer, and is connected to the second mounting electrode to form a pn bonding in the lower semiconductor layer.

11. The supporting substrate according to claim 9, further comprising:
a metal electrode layer that is provided on the upper semiconductor layer and connected to the at least one second wiring electrode.

* * * * *